United States Patent [19]

Schairer

[11] Patent Number: 5,084,804
[45] Date of Patent: Jan. 28, 1992

[54] WIDE-AREA LAMP

[75] Inventor: Werner Schairer, Weinsberg, Fed. Rep. of Germany

[73] Assignee: Telefunken electronic GmbH, Heilbronn, Fed. Rep. of Germany

[21] Appl. No.: 421,234

[22] Filed: Oct. 13, 1989

[30] Foreign Application Priority Data

Oct. 21, 1988 [DE] Fed. Rep. of Germany ....... 3835942

[51] Int. Cl.$^5$ .............................................. B60Q 1/00
[52] U.S. Cl. ...................................... 362/61; 362/80; 362/245; 362/250; 362/328; 362/800
[58] Field of Search ................... 362/61, 80, 800, 245, 362/250, 327, 328; 357/72, 67, 68

[56] References Cited

U.S. PATENT DOCUMENTS

| | | | |
|---|---|---|---|
| 3,694,902 | 10/1972 | Apgar et al. | 29/588 |
| 3,820,237 | 6/1974 | Effer | 29/588 |
| 3,914,786 | 10/1975 | Grossi | 357/68 |
| 4,467,193 | 8/1984 | Carroll | 362/800 |
| 4,733,335 | 3/1988 | Serizawa et al. | 362/800 |

FOREIGN PATENT DOCUMENTS

| | | |
|---|---|---|
| 0127239 | 12/1984 | European Pat. Off. . |
| 0263277 | 4/1988 | European Pat. Off. . |
| 1262448 | 3/1968 | Fed. Rep. of Germany . |
| 3315785 | 11/1984 | Fed. Rep. of Germany . |
| 3148843 | 6/1985 | Fed. Rep. of Germany . |
| 3538986 | 5/1987 | Fed. Rep. of Germany . |
| 3625767 | 9/1988 | Fed. Rep. of Germany . |
| 1449911 | 4/1966 | France . |
| 1543748 | 10/1968 | France . |
| 8009716 | 4/1980 | France . |
| 8205189 | 3/1982 | France . |
| 2518317 | 12/1982 | France . |
| 2545195 | 11/1984 | France . |
| 60-49682 | 2/1985 | Japan . |
| 237482 | 10/1986 | Japan . |

OTHER PUBLICATIONS

IBM Techn. Discl. Bulletin, 1987, vol. 30, No. 6, S. 349-350 Kirby, Peter: A Flexible Approach to Drip Carrier Mounting, In: Electronic Engineering, Jul. 84, 5-39-42.

Primary Examiner—Ira S. Lazarus
Assistant Examiner—Sue Hagarman
Attorney, Agent, or Firm—Spencer & Frank

[57] ABSTRACT

The invention relates to a wide-area lamp in which luminescent semiconductor elements in a wide-area spread are connected to one another by a conducting path structure and the individual luminescent semiconductor elements are surrounded by casing elements. The invention provides for the conducting path structure between the individual casing elements to be designed movable such that the lamp can be curved to any shape required. The casing elements are here surrounded by parabolic reflectors, with the conducting path structure with the semiconductor elements being so arranged that one semiconductor element is in the focal point of each reflector.

20 Claims, 2 Drawing Sheets

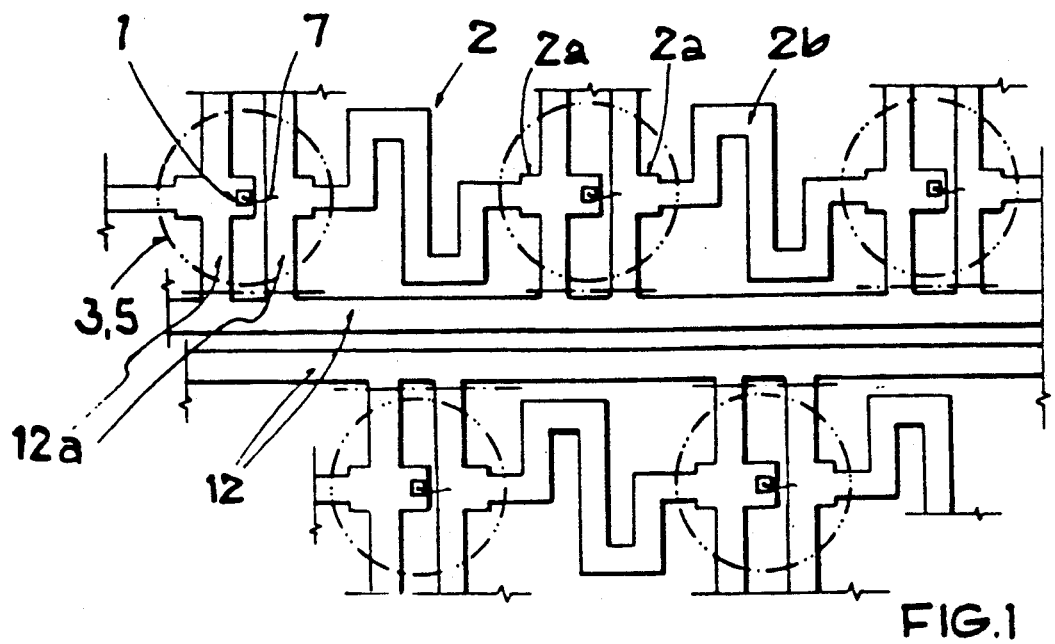
FIG.1
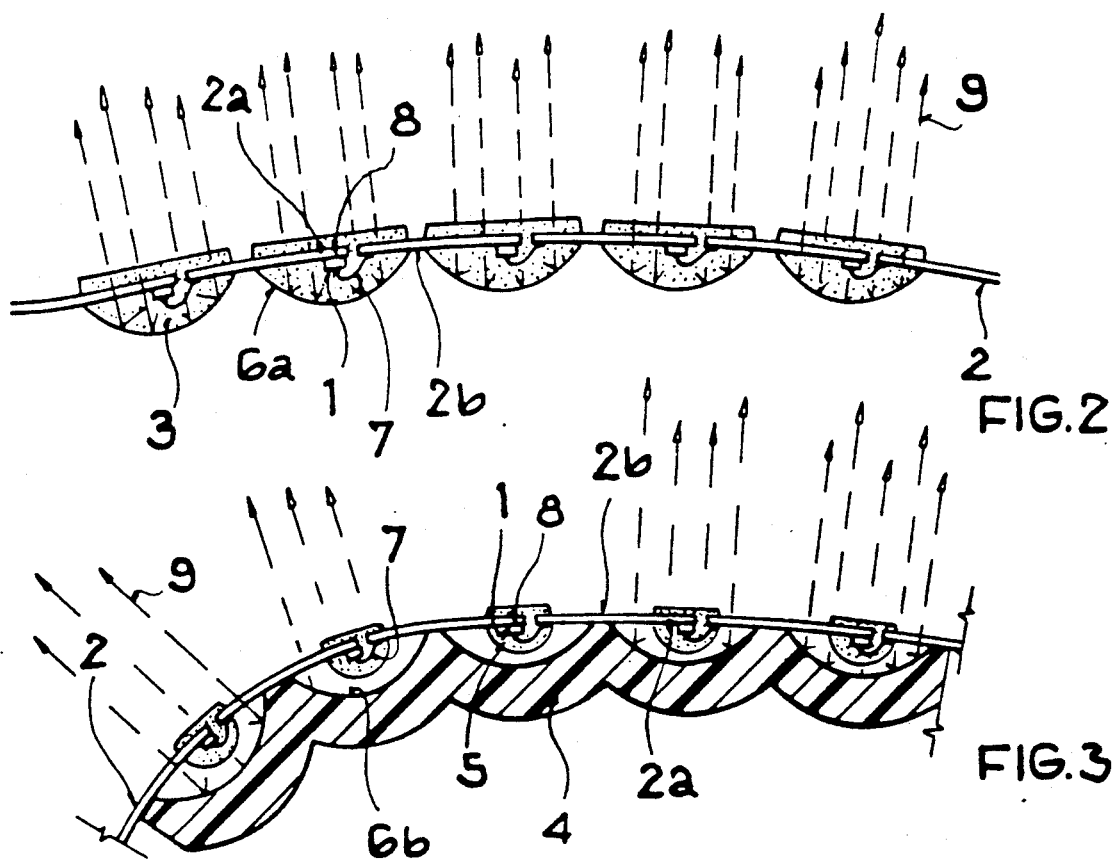
FIG.2
FIG.3

WIDE-AREA LAMP

BACKGROUND OF THE INVENTION

The invention relates to a wide-area lamp.

In wide-area lamps, for example automobile lights, bulbs are used as a rule, mostly together with a reflector. However, bulbs have only a limited life, and in addition their dimensions entail a relatively deep design.

By contrast, luminescent diodes have the advantage that they have a longer life and therefore operate more dependably, that they have a better electro-optical efficiency and therefore a lower energy requirement, and that shallower construction depths are possible thanks to their flat structure. Luminescent diodes are therefore preferably used where replacement of individual bulbs is awkward and expensive, and where high demands are placed on dependability, safety and long-term stability of the lamp.

To make a lamp with high efficiency and shallow construction depth, it has already been proposed to mount luminescent semiconductor elements, each surrounded by a casing element, in a wide-area spread on a level glass plate.

In many applications, for example in automobile construction, the lamps are curved in shape. The glass plate on which the luminescent semiconductor elements are fitted cannot however be curved as required, for example by bending. The plate must therefore already be curved at the manufacturing stage; however, mounting the semiconductor elements on a curved surface entails considerable difficulties.

OBJECTS AND SUMMARY OF THE INVENTION

The object of the invention is to avoid these drawbacks and to provide a lamp that permits easy assembly of the semiconductor elements but can still assume a curved form if required.

This is achieved in accordance with the invention by designing the conducting path structure between the individual casing elements sufficiently movable for the lamp to be curved into any shape required.

Further advantageous embodiments of the invention are described in the sub-claims.

The semiconductor elements are arranged in a number suitable for the respective needs, e.g. required light intensity or curvature of lamp, on the conducting path structure, preferably in an even spread. If high light beam power is required, the semiconductor elements are adjacent no more closely than as not to restrict the mobility of the conducting path structure.

BRIEF DESCRIPTION OF THE DRAWINGS

The manufacturing process for the lamp in accordance with the invention and its embodiments will now be described on the basis of FIGS. 1-4, in which:

FIG. 1 shows a plan view of the conducting path structure with the semiconductor elements, FIG. 2 shows a section through the wide-area lamp in which the reflectors are designed in solid form, FIG. 3 shows a section through the wide-area lamp in which the reflectors are designed in hollow form.

DESCRIPTION OF THE PREFERRED EMBODIMENTS

Figure 4:
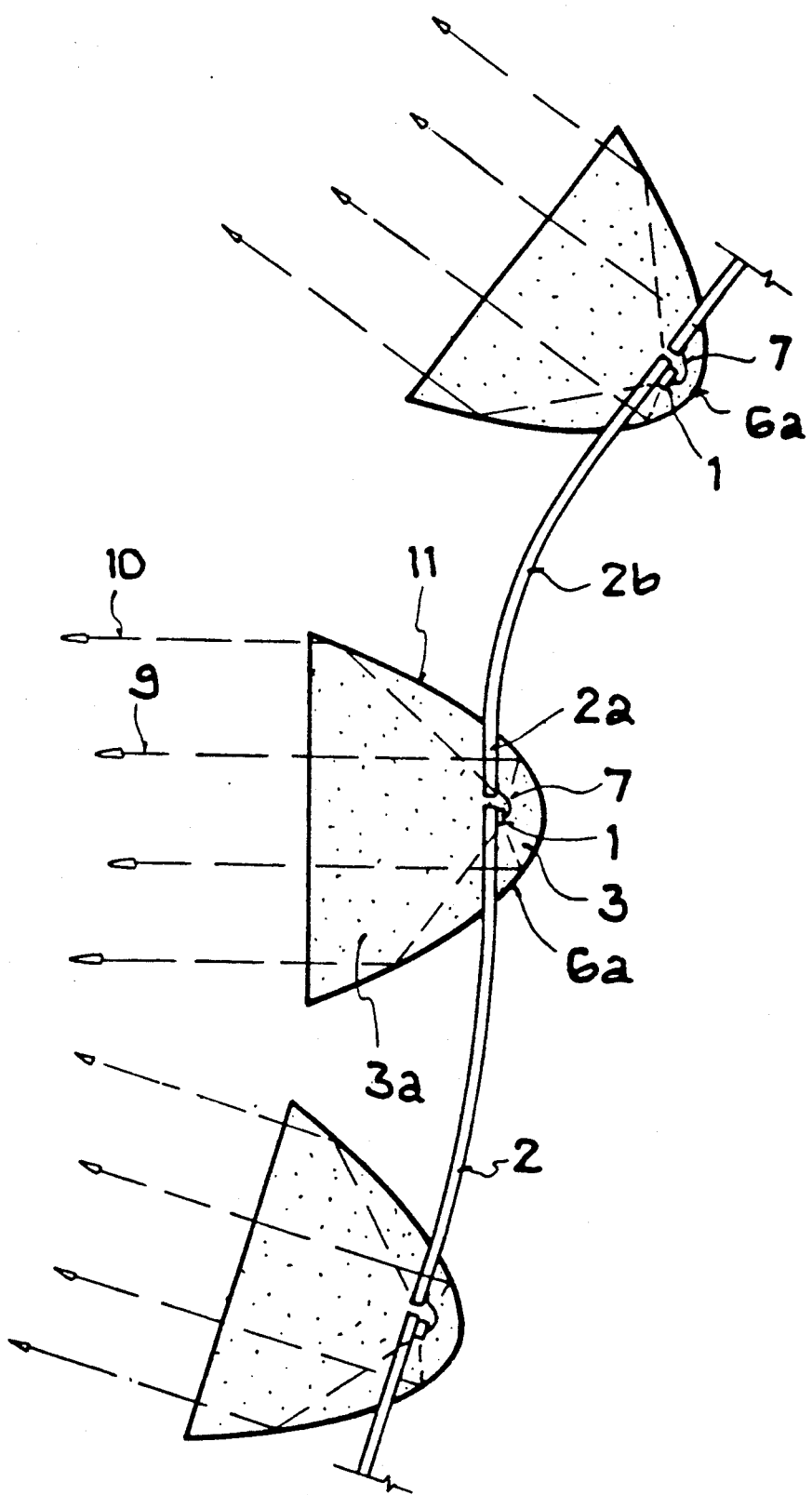
FIG. 4 shows a section through the wide-area lamp in which the reflectors designed in solid form are arranged both above and below the conducting path structure.

The manufacturing processes of the conducting path structure and the mounting of the luminescent semiconductor elements on the planar conducting path structure is explained in FIG. 1. Metal strips are punched out of a metal sheet or plate, where a certain shape is cut to provide flexible conducting path sections 2b and auxiliary connectors 12. The metal strips 2a, 2b are specially coated, for example with a nickel adhesive layer and a silver layer above it, and are used as conducting paths for providing contacts on the semiconductor element 1 and connecting it up. The auxiliary connections 12 are used for mechanical stabilization of the conducting path structure 2. The connecting pieces 12a from the conducting path structure 2 to the auxiliary connections 12 are preferably fitted outside the area of the semiconductor elements 3, 5, i.e. in the movable part 2b of the conducting path structure to ensure optimum exploitation of the light beams.

The semiconductor elements 1, having for example an extent of 250 $\mu m \times 250$ $\mu m$, are glued or soldered onto the part 2a of the planar conducting path structure, preferably by automatic fitting, and connected using bonded wires 7 to the next strip position, i.e. to the next conducting path section. For example, those points on the conducting path structure on which the semiconductor elements 1 are to be attached are provided with drops of conductive adhesive. The semiconductor elements are then placed in these drops and the adhesive is set at a temperature of 150° C., for example.

An embodiment is described in FIG. 2 in which the reflectors are designed in solid form.

The conducting path structure 2 with the semiconductor elements 1 fastened on it and provided with contacts is now placed on a preferably parabolic mold such that the semiconductor elements 1 are in the focal point of the parabola and the moving parts 2b of the conducting path structure are between the recesses of the mold. The mold preferably comprises a plastic material and can be made in the required form using plastic injection molding methods. To make the reflectors 6a, the mold is filled with a plastic sealing compound, for example silicone resin, epoxy resin, polyimide or polyphenylene sulfide. Each semiconductor element 1 is therefore located at the focal point of the parabolic plastic casing element 3.

After setting of the sealing compound, for example at 150° C., and demolding by removal of the casting mold, the outer surface of the plastic element 3 can be coated with a highly reflective material, for example aluminum or silver, in order to form the reflectors 6a. Care must be taken here that the electric power lines 2a are not short-circuited. The parabolic form of the reflectors 6a bunches the entire reflected light beams 9 parallel to achieve the maximum possible luminous efficiency.

The auxiliary connections 12 for stabilization of the conducting path structure are now no longer required and are removed again by cutting them free along the dash-dotted lines in FIG. 1. The entire lamp is then pressed against a base into the required shape, for example into a curve. The movable conducting path sections 2b between the casing elements 3 ensure that the lamp can assume any shape. The base can double as a stabilizing rear wall; the lamp is then fixed on this base, for example by glueing. If the mold is still required for stability or protection of the reflecting surfaces, for example, it is not removed after hardening of the sealing compound; it must however already possess the required shape of the lamp. The inside of the mold is then made highly reflecting, to which end it can be coated with a highly reflecting material, for example, prior to insertion of the sealing compound.

The contact surface 8 on the rear of the semiconductor element is designed to be as highly reflecting as possible, so that the light beams emitted in the direction of the conducting path structure are largely reflected and contribute to the light beams 9 emitted directly in the direction of the reflector and reflected there, and hence to the overall emission, thereby achieving high collective efficiency.

In a further embodiment in accordance with FIG. 3, the reflectors 6b are designed, by virtue of a shaped element 4, in hollow form.

Mounting and contacting of the semiconductor elements 1 on the conducting path structure 2 is implemented in the same manner as described for the embodiment in FIG. 1. In order to improve the light beam output from the luminescent semiconductor element 1, a synthetic resin having a refractive index of approx. 1.5, for example, is dripped onto the semiconductors, so that the semiconductor elements 1 are embedded in a casing element 5. The conducting path structure 2 with the semiconductor elements 1 is, following removal of the auxiliary connections 12, placed on the shaped element 4, which must already have the required form of the lamp and can, for example, double as the rear wall of the casing. The conducting path structure 2 is connected to the shaped element 4 without sealing, for example by glueing it to certain points of the conducting paths. The inside of the shaped element is highly reflective and can be coated, for example, with a highly reflective material before being connected to the conducting path structure. Here too, only the light beams 9 reflected by the reflector 6b are predominantly output.

In another embodiment shown in FIG. 4, a lamp in accordance with FIG. 2 is first formed in solid form, and further plastic elements 3a, which can be manufactured using separate casting molds or injection molds, are deposited on the upper side of the conducting path structure, for example using an optical adhesive. These additional plastic elements 3a have the shape of a truncated parabola and are glued to the upper side of the conducting path structure in such a way that the casing elements 3, 3a above and below the conducting path structure 2 together result in a parabolic profile. The outer surfaces of the plastic elements 3a are coated with a highly reflective material to form the reflectors 11.

In this embodiment, both a major proportion of the light beams 10 emitted to the conducting path structure through the reflectors 11 and the light beams 9 reflected at the reflectors 6a are bunched so that the luminous intensity and the degree of light use are increased.

The plastic elements 3a of the reflectors 11 above the conducting path structure are preferably made of the same material as the plastic element 3 of the reflectors 6a below the conducting path structure.

The contacting and wiring of the semiconductor elements 1 in accordance with FIG. 1 depends on the specification of the lamp. The semiconductor elements 1 can be attached over the whole available surface and be connected in series to increase the operating voltage and/or connected in parallel to achieve the required luminous intensity. This interconnection can be varied here as required to suit the given layout of the conducting path structure 2. The semiconductor elements 1 are preferably arranged on the conducting path structure 2 in such a way that for certain requirements a maximum luminous intensity is achieved. For this purpose it is possible to place casing elements 3, 5 so closely adjacent that on the one hand the space available on the conducting path structure is optimally exploited without however the mobility of the conducting path structure being unduly restricted on the other hand.

The form of the lamp, the number of luminescent diodes used, their connection, and the wavelength of the emitted light beams can be preset exactly to comply with specific requirements, with the spectral range of the emitted light beams being capable of being shifted without problem into the infra-red range, e.g. by using GaAs diodes.

The luminescent diodes used typically have a forward voltage of 2 V and a permissible current intensity of 50 mA, so that for example approx. 5 to 6 diodes must be connected in series for an operating voltage of 12 V.

The luminous flux of a single luminescent diode is typically 1–4 lm, the luminous intensity approx. 1–3 cd; for an automobile stop light, for example, the luminous intensity must be between 40 and 100 cd.

In order to obtain red light-emitting lamps GaAlAs heterostructure diodes can be used, the maximum emission of which is 660 nm.

The lamp in accordance with the invention can be used in many applications; for example, it might be used as an automobile light, signal light or side light.

What is claimed is:

1. A wide-area lamp wherein: a plurality of luminescent semiconductor elements in a wide-area spread are mounted directly on and connected to one another by a conducting path structure; wherein each semiconductor element and an adjacent respective portion of said connector path structure is surrounded by a respective casing element; the casing elements are surrounded in part by respective reflectors; and the conducting path structure between said individual casing elements is movable such that the lamp can be curved to the shape required.

2. A wide-area lamp according to claim 1, wherein the reflectors are parabolic in form and wherein the conducting path structure with the connected semiconductor elements is arranged such that in each case one semiconductor element is in the area of the focal point of a respective said reflector.

3. A wide area lamp according to claim 2 wherein said semiconductor elements and said reflectors are arranged on a lower side of said conducting path structure.

4. A wide-area lamp according to claim 3, wherein: additional reflectors are arranged on the upper side of the conducting path structure; and each additional reflector has the shape of a truncated parabola and together with a respective reflector on the underside of said conducting path structure has the form of a respective paraboloid.

5. A wide-area lamp according to claim 4, wherein the additional reflectors on the upper side of the conducting path structure are plastic elements whose outer surfaces are highly reflective.

6. A wide-area lamp according to claim 2, wherein each said casing element is formed of plastic in which the respective said semiconductor element is embedded, wherein the respective outer faces of said plastic casing elements are of said parabolic form, and wherein said reflectors are disposed on said outer faces.

7. A wide-area lamp according to claim 6, wherein the respective outer faces of the plastic casing elements each are surrounded by a mold whose inside forms the respective reflector.

8. A wide area lamp according to claim 6 wherein said reflectors are reflective coatings disposed on said outer faces of said casing elements.

9. A wide-area lamp according to claim 2, wherein the casing elements of the semiconductor elements are formed of transparent plastic and are surrounded in part by a shaped element whose inside forms the reflectors, and wherein there is air between each plastic casing element and said shaped element.

10. A wide-area lamp according to claim 1, wherein the semiconductor elements are connected in parallel and/or in series by means of the conducting path structure.

11. Use of a wide-area lamp according to claim 1 for automobile lights, signal lights or side lights.

12. In a method for manufacturing a wide-area lamp according to claim 2, the improvement wherein: initially the semiconductor elements are mounted and provided with contacts on a self-supporting conducting path structure stabilized by auxiliary path connections; wherein the semiconductor elements are provided with said casing elements; and wherein the auxiliary connections are subsequently removed.

13. A method according to claim 12, wherein the semiconductor elements are sealed in plastic with the aid of a mold for forming said casing elements, wherein after removal of the mold the outer surfaces of said casing elements are coated with a highly reflective material, wherein the auxiliary connections are subsequently removed by being cut free, and wherein the conducting path structure is provided with a certain curvature required by bending it between said casing elements.

14. A method according to claim 12, wherein the inner surfaces of a mold having a certain curvature required is coated with a highly reflective material, wherein the semiconductor elements are sealed in said mold with a plastic to form said casing elements, and wherein the auxiliary connections are removed by being cut free without removing said mold.

15. A method according to claim 12, wherein the semiconductor elements have a plastic material dripped onto them to form said casing elements, wherein the inner surface of a shaped element having a certain curvature required is coated with a highly reflective material, and wherein the conducting path structure with said semiconductor elements is placed on said shaped element and glued to said shaped, element after cutting free the auxiliary connections.

16. A method according to claim 12, wherein said semiconductor elements and said casing elements are disposed on a lower side of said stabilized conducting path structure; and further comprising attaching additional casing elements to the upper side of said stabilized conducting path structure and metallically coating the outer surfaces of said additional casing elements.

17. A wide area lamp according to claim 1 wherein said reflectors are parabolic and each of said luminescent semiconductor elements is disposed on a surface of said conducting path structure which faces the surface of the respective said reflector.

18. A wide area lamp comprising:
a plurality of luminescent semiconductor elements arranged in a wide-area spread;
a conductor path structure including a plurality of flat metal flexible conductors formed from a flexible sheet of metal for physically and electrically connecting said elements together, with each of said semiconductor elements being mounted on one surface of and electrically contacting one end of one said conductor and being electrically connected to an end of an adjacent different one of said conductors;
a respective plastic housing element surrounding and embedding each of said semiconductor elements and the associated said ends of said conductors so that said conductors between said housing elements remain flexible, whereby said lamp can be curved to a desired shape by flexing of the conductors between said housing elements; and
a respective reflector partially surrounding each said casing element such that said one surface of each said conductor faces the surface of the respective said reflector.

19. A wide area lamp comprising:
a plurality of luminescent semiconductor elements arranged in a wide-area spread;
a conductor path structure including a plurality of flat metal flexible conductors formed from a flexible sheet of metal for physically and electrically connecting said elements together, with each of said semiconductor elements being mounted on one surface of and electrically contacting one end of one said conductor and being electrically connected to an end of an adjacent different one of said conductors;
a respective plastic housing element surrounding and embedding each of said semiconductor elements and the associated said ends of said conductors so that said conductors between said housing elements remain flexible, whereby said lamp can be curved to a desired shape by flexing of the conductors between said housing elements, and with the outer surface of each of said housing elements facing said one surface of said conductors having the shape of a paraboloid, and with each said semiconductor element being disposed in the area of the focal point of the respective said parabola of the associated said housing element.

20. A wide area lamp as defined in claim 19 further comprising a respective reflective surface disposed adjacent and covering said outer surface of each of said housing elements.

* * * * *